United States Patent [19]
Norrell

[11] 4,370,650
[45] Jan. 25, 1983

[54] TONE DETECTION CIRCUITRY

[75] Inventor: Donald L. Norrell, Woodbury, Minn.

[73] Assignee: Minnesota Mining and Manufacturing Company, St. Paul, Minn.

[21] Appl. No.: 249,882

[22] Filed: Apr. 1, 1981

[51] Int. Cl.[3] .................. H04Q 9/00; H04Q 11/02; G01R 23/02
[52] U.S. Cl. .................. 340/825.71; 340/825.48; 324/78 Z
[58] Field of Search .................. 340/825.71, 825.48, 340/825.75; 324/79 R, 78 Z, 79 D

[56] References Cited

U.S. PATENT DOCUMENTS

| | | | |
|---|---|---|---|
| 3,952,288 | 4/1976 | Carpenter et al. | 340/825.75 |
| 4,208,626 | 6/1980 | Gregg, Jr. | 324/79 D |
| 4,215,308 | 7/1980 | Kusters | 324/78 Z |
| 4,236,110 | 11/1980 | Shearer et al. | 324/79 R |
| 4,271,746 | 6/1981 | Dobbie | 324/78 Z |

OTHER PUBLICATIONS

"A Switchable Active Filter Hybrid", M. Probstein, IEEE Transactions on Parts, Hybrids, and Packaging, Sep., 1976, vol. PHP-12, No. 3, pp. 201-206.

*Primary Examiner*—Donald J. Yusko
*Attorney, Agent, or Firm*—Cruzan Alexander; Donald M. Sell; Robert L. Marben

[57] ABSTRACT

Tone detection circuitry including tone decoder providing a free running frequency determined by timing resistance and timing capacitance connected to it. A control means including a programmable microprocessor establishes a retrieval record based on the product of the timing resistance and timing capacitance needed to establish the center frequency of the tone decoder for a plurality of bandwidths. The retrieval record is used to establish the product of the timing resistance and timing capacitance when a tone within the selected bandwidth is to be detected.

6 Claims, 8 Drawing Figures

TONE DETECTION CIRCUITRY

BACKGROUND OF THE INVENTION

1. Field of the Invention

The invention presented herein relates to tone detection circuitry and in particular to tone detection circuitry providing for the detection of a plurality of tone signals.

2. BACKGROUND ART

Integrated phase locked loop tone decoder circuits, such as those available from Signetics, Inc. under the type designation NE567, are well known. Such circuits require the user only to add two filter capacitors, a timing capacitor and a timing resistor. The timing capacitor and timing resistor determine the free running or center frequency of the circuit at which it operates in the absence of an input signal within the detection bandwidth of the circuit. Such integrated circuits provide for a maximum detection bandwidth of approximately 14% of the center frequency. Use of the integrated circuits in this manner, requires the use of an adjustable potentiometer as a part of the timing resistance, since timing components, including the integrated circuit itself, limit the center frequency accuracy to ±10 to 30%. Also, once the center frequency is set, only signals within the circuit bandwidth for that center frequency may be detected so a different integrated circuit is normally used for each tone to be detected. In addition, since the timing components are influenced by various factors such as time, temperature and supply voltage, several readjustments on the potentiometer may be required over the life of the circuit. With such an arrangement, the bandwidth provided is too great for some applications. An improved tone detection circuit arrangement was developed for the detection of a tones for each of a plurality of bandwidths wherein a number of selectively connectable timing resistors were used with their connection in parallel to the integrated tone decoder circuit controlled by a counter. The counter automatically switched the various resistors in parallel to the integrated tone decoder to establish new free running frequencies for the integrated tone decoder circuit. Upon receipt of a tone within an existing detection bandwidth, the integrated tone decoder circuit locks in on the frequency of the detected tone. A program was provided for monitoring the lock indicator output of the integrated tone decoder circuit. When a lock indicator output was produced, the circuitry measured the locked frequency of the integrated tone detector circuit and compared it to information regarding various tone frequencies to be detected to determine whether a desired tone frequency had been detected. While this improved arrangement reduced the number of integrated tone decoder circuits needed for detection of a plurality of tones and allowed the bandwidth for an acceptable tone to be narrowed, the arrangement is not acceptable for use in situations where the duration of the tone signals to be detected are about the same or less than the time required to connect the various timing resistors to the integrated tone decoder. In addition, in situations where there are certain times when the various desired tones are expected, this prior art arrangement can lock on a tone that is not being sought at a particular time and miss the detection of a tone that is sought.

SUMMARY OF THE INVENTION

The invention presented herein avoids the disadvantages presented by the prior art tone detection circuits, particularly, in cases where there is to be detection of a plurality of tone signals and it is known when a particular tone or tones should be present that requires detection. The tone detection circuitry embodying the present invention serves to determine the receipt of a tone signal having a frequency within a selected one of a plurality of bandwidths. It includes a tone decoder which provides a signal output at a free running frequency that is inversely proportional to the product of the timing capacitance and timing resistance connected to it and which provides a signal output at the frequency of an input tone signal when such input tone signal is within the response bandwidth of the decoder. A fixed timing capacitance can be used with the timing resistance changed to establish the free running frequency of the tone decoder as close as possible to the center frequency of each of the plurality of bandwidths. A plurality of resistors, which are selectively connectable in parallel to the tone decoder, can be used for establishing the timing resistance for the tone decoder. A control means is operatively connected to the tone decoder and the plurality of resistors. The control means provides a calibration routine which is operable subsequent to each energization of the control means; for determining and providing a retrievable record of which resistor of the plurality of resistors are to be connected in parallel for each of the plurality of bandwidths to establish the free running frequency of the tone decoder as close as possible to the center frequency of each of the plurality of bandwidths. The control means also provides for the selective retrieval of the retrievable record for any one of the plurality of bandwidths and the connection of the plurality of resistors in parallel in accordance with the retrieved record. The control means also provides for the measuring of any signal output from the decoder. The control means is provided with information with respect to each center frequency and the bandwidth for each of the plurality of bandwidths for making a determination with respect to a selected center frequency and bandwidth as to whether the measured signal output is higher or lower than the center frequency and within the bandwidth. The control means includes a memory for storing the retrievable record, a memory containing information of each center frequency and the bandwidth and a programmed microprocessor that is operatively connected to the plurality of resistors, the tone decoder and the two memories. The control means also includes an interface adapter operatively connecting the tone decoder to the programmed microprocessor and the two memories.

A plurality of switches, one for each resistor of the plurality of resistors, is provided with each of the switches operatively connected to the programmed microprocessor via the interface adapter for selective operation by the programmed microprocessor.

With the foregoing arrangement, the retrievable record of the timing resistance to be used for each of the plurality of bandwidths can be produced each time the circuitry is used thereby eliminating any problem presented by variations in the timing components due to various factors including time, temperature and supply voltage and allows the circuitry to be programmed in accordance with the order and time during which the circuitry is arranged to detect the various tones it is capable of detecting thereby eliminating the detection of unwanted tones and providing for the detection of tones of a short duration.

It is also possible to use a fixed timing resistance and change the timing capacitance to establish the desired free running frequencies.

DESCRIPTION OF THE DRAWING

For more complete understanding of the invention reference should be made to the accompanying drawing wherein:

FIGS. 2-8 are flow diagrams relating to the operation of the circuitry of FIG. 1.

DETAILED DESCRIPTION

Figure 1:
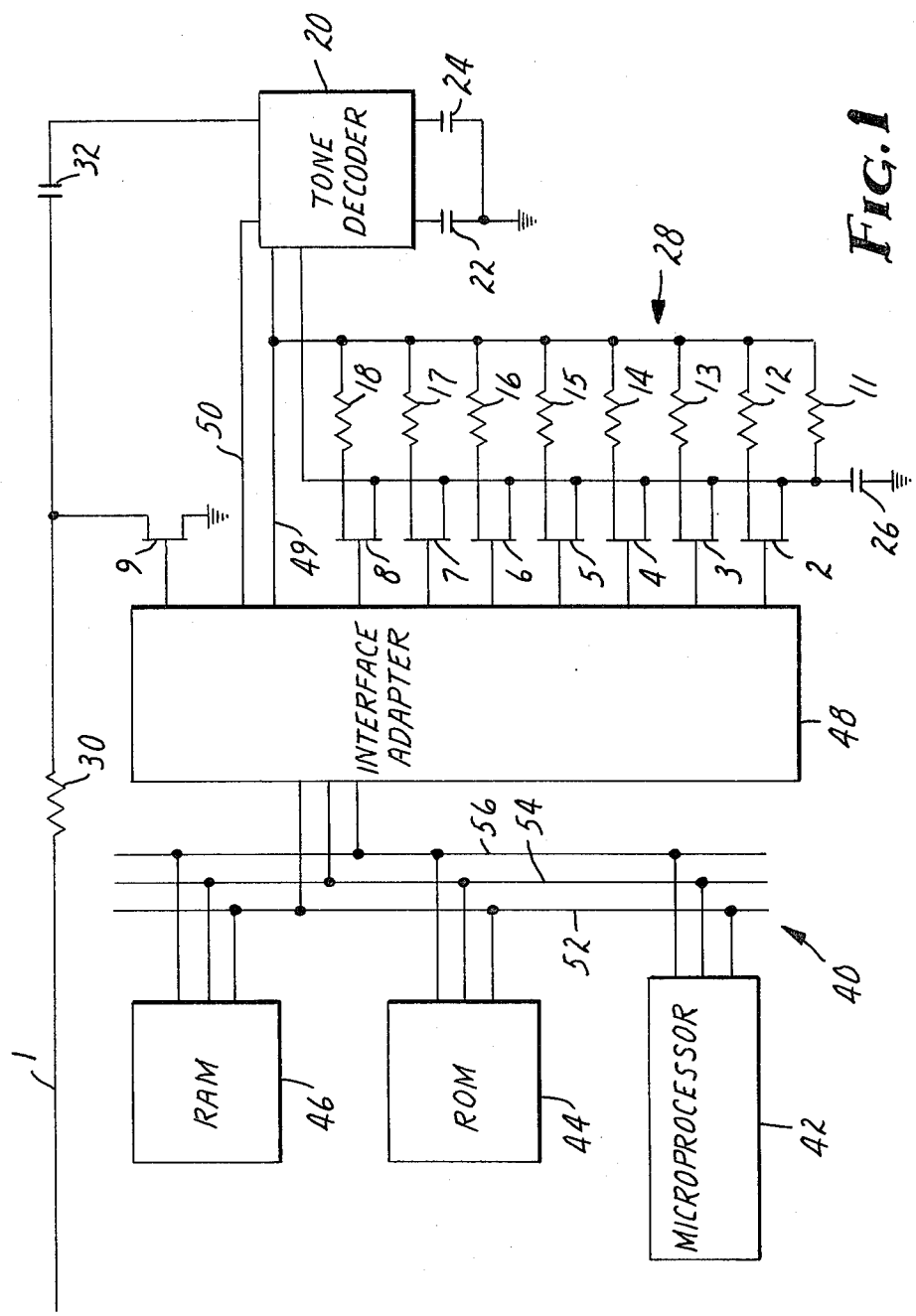
FIG. 1 is a schematic of circuitry embodying the invention.

Referring to FIG. 1 of the drawing, a preferred embodiment of the invention is shown which includes a tone decoder 20, two filter capacitors 22 and 24, a timing capacitor 26, timing resistance 28. The invention requires an arrangement wherein the product of the timing capacitance 26 and timing resistance 28 can be changed. Two possible arrangements for accomplishing this involve either the use, as shown in FIG. 1, of a fixed capacitor for the timing capacitance 26 with the timing resistance 28 provided by a plurality of resistors 12-18 connectable in parallel with resistor 11 via electronic switches 2-8, respectively, or the use of a fixed resistance in place of capacitor 26 plus a capacitor in place of each of the resistors 12-18 of FIG. 1. An input signal is received at conductor 1 and is applied to the tone detector via a resistor 30 and a series connected capacitor 32. Calibration of the circuitry of FIG. 1 is carried out each time it is used requiring the elimination of any input signal to the tone detector 20 when the calibration is being done. Removal of any input signal to the tone decoder 20 is accomplished by the use of a electronic switch 9 which when conducting connects the resistor 30 to ground thereby removing any input to the tone detector 20. It is also possible to connect the electronic switch 9 in series with the input to the tone decoder 20 and have it arranged to conduct except when it is necessary to isolate the tone decoder 20 from any input signal. The circuitry of FIG. 1 also includes a control means 40 provided by a microprocessor 42, a read only memory (ROM) 44, a random access memory (RAM) 46, and an interface adapter 48 which are all interconnected.

The tone decoder 20 can be a commercially available integrated circuit available from Signetics, Inc. under the type designation NE567. The NE567 tone decoder is a phase locked loop type tone decoder. The maximum detection bandwidth of an NE567 tone decoder is about 14% of the center frequency. The center frequency is determined by the timing resistance 28 and timing capacitance 26 that is used. The tone decoder 20 provides an output on conductor 49 at its center frequency or at the frequency of any signal received at the input of the tone decoder that is within the then existing bandwidth of the decoder. In addition, the tone decoder 20 provides an indication on output conductor 50 when the decoder has locked to an incoming signal. The presence of a locked output on conductor 50 is used to indicate that a measurement should be made of the output on conductor 49.

The electronic switches 2-9 can be provided by field effect transistors wherein the gate of each of the transistors is connected to the interface adapter 48. Conduction of a field effect transistor determines whether the resistor that is connected to its source electrode will be effectively connected in parallel with resistor 11. For example, if field effect transistor 2 is conducting, resistor 12 is connected in parallel with resistor 11.

The interface adapter 48, microprocessor 42, ROM 44, and RAM 46 are interconnected via a control bus 52, an address bus 54 and a data bus 56. The interface adapter 48 can be an integrated circuit available from the Rockwell Corporation under the type designation R6522 and is referred to as a versatile interface adapter. The microprocessor 42 can also be one that is commercially available such as that available from the Rockwell Corporation under the type designation R6502.

The interface adapter 48 has four functions. First, it is used for the control of the electronic switches 2-9. Second, it contains an integral timer used as a timing standard during the frequency measurement of the signals presented at the output conductor 49 from the tone decoder 20. Third, it has an internal counter for counting each cycle of a signal provided at the output conductor 49 of tone decoder 20 and finally, it provides an input for the locked output provided at conductor 50 from tone decoder 20 which is presented whenever the tone decoder 20 is locked to an incoming signal.

The ROM 44 holds program instructions for the microprocessor 42 and a frequency measurement table. The frequency measurement table has three 8 bit entries for each tone that is to be detected. Two of the entries are for the center frequency and one is for bandwidth information. The first two entries for each tone hold the upper and lower half of a 16 bit value which corresponds to the number of time intervals indicative of frequency, which can be based on the number of 256 microsecond intervals required for 128 cycles of a given frequency. For example, 128 cycles of 1100 HZ require 454, 256 microsecond intervals. Therefore, the interval for the first two entries RO1 and RO2 for a 1100 HZ tone is equal to 454. A plus or minus 5% bandwidth would require the third or bandwidth information entry RO3 for the frequency measurement table for 1100 HZ to be 23, i.e., 5% of 454 intervals.

The RAM 46 is used to store the status for switches 2-8 required to set the center frequency of the tone decoder within the easy reach (of for example 3%) of each of the tones to be detected. The RAM is organized in 8-bit bytes. These RAM values are determined by a calibration program which is utilized before the detector circuitry is used in an operation of circuitry or equipment that includes the detector circuitry and the values remain for that operation of the circuitry or equipment.

Before considering the operation of the circuitry of FIG. 1 in any great detail, a general outline of the functions that are carried out for detection of tones will be given. For a better appreciation of the functions, flexibility and utility afforded by the circuitry of FIG. 1 for tone detection, the functions will be considered with respect to the tone detection requirements involved in the operation of facsimile machines which conform to CCITT Group I and II standards. These standards require the detection of five different tones. In addition, the circuitry of FIG. 1 provides for the detection of a sixth tone used in older facsimile equipment to make equipment forming to the CCITT Group I and II standards compatible with older equipment. The six tones required to be detected include 1100 HZ, 1300 HZ, 1650 HZ, 1850 HZ, 2100 HZ and 2400 HZ (additional tone). The circuitry of FIG. 1 measures the frequency of a signal from the tone decoder 20 by using two counters which are available in the interface adapter 48 of the R6522 type. One counter is used to count the cycles of the signal from the tone decoder 20 until a count of 128 is reached. While such count is made the second counter is used to count the number of time intervals per the time interval used to establish the frequency measurement table, for example 256 microsecond intervals, that occur in the time the other counter takes to count to 128. The number of time intervals counted by the second counter is the frequency measurement which is then compared with the information for the particular frequency of interest that is available from the frequency measurement table stored in the ROM 44. Two items can be determined by the frequency measurement made with respect to the frequency of interest. One is a determination as to whether the measured frequency is higher or lower than the value in the ROM 44 for the frequency of interest. The other is a determination of whether the measured frequency is within the bandwidth per the frequency measurement table.

Before the circuitry of FIG. 1 is placed in operation to detect any tone, a calibration routine is carried out which serves to establish which of the switches 2–8 are to be operated to cause the tone decoder to operate at the closest center frequency for each of the six tones that will be detected at various times. Based on information with respect to the tone or tones to be detected at a particular phase of operation of the facsimile machine, the appropriate combination of switch settings are obtained from the RAM 46 and used to connect resistors 12–18 in parallel with resistor 11 per the switch settings to cause the tone decoder 20 to free run near the frequency of the tone that is to be detected. Once the tone decoder 20 locks to the frequency of an incoming tone the circuitry carries out a measurement routine which determines whether the frequency measured is higher or lower than the nominal value per the frequency measurement table stored in the ROM 44 for the tone that is sought and whether the measured frequency is within the bandwidth prescribed per the frequency measurement table stored in the ROM 44 for the tone being sought. Once the tone that is sought is detected, such detection is utilized to cause the operation of the facsimile machine to proceed to the next phase of its procedure at which time another of the six tones may be sought.

The manufacturer's specifications for an NE567 tone decoder indicate that the center frequency $=1.1/RC$, where R is the total resistance presented between the capacitance 26 and the toner decoder 20 of FIG. 1 and C is the capacitance presented by capacitor 26 of FIG. 1. The manufacturer's specifications also indicate the range of R that can be used, for example, the range of R may be $2\ k \leq R \leq 20\ k$ ohms. The value for capacitor 26 is selected using the value of the maximum R allowed and the minimum center frequency for the range of tones of interest such that $C=1.1/(F_{min} \times R_{max})$.

Many algorithms may be used for the calibration routine, such as determining the frequency for all 128 combinations of the resistor 12–18 that can be used with the resistor 11. A very simple and fast approach, however, is a technique called successive approximation. This technique involves arranging the resistors 12–18 in order of increasing magnitude. Resistor 12, the smallest of resistors 12–18, is first connected by itself in parallel with resistor 11. If the resulting frequency is higher than the desired frequency, for example 1100 HZ, the switch 2 is turned off to remove resistor 12 and resistor 13 is connected in parallel with resistor 11 by turning switch 3 on. If the result is then too low with respect to the frequency sought, resistor 13 is left connected and resistor 14 is connected in parallel with resistors 13 and resistor 11. The process is repeated until all of the resistors 12–18 have been tried for each frequency. Information reflecting the combinations of the resistors 12–18 that are required for the six tones are stored in the RAM 46. An 8-byte memory location in the RAM 46 is used for each tone to be detected. This location is used to hold the on/off status for the seven switches 2–8 for each particular phase locked loop center frequency. The sole purpose of the calibration routine is to determine the switch settings for switches 2–8 for each of the tones to be detected and to store them. Assuming that M1–M6 are the six money locations corresponding to the tones 1100, 1300, 1650, 1850, 2100, and 2400 HZ, respectively, and that eah bit and each location corresponds to a switch setting. Then, every bit may be uniquely represented by $M_{ij}$, where i is the memory location for tone i and j is a bit within a location. If there are six memory locations of 8 bits each, $M_{11}$ identifies the first (most significant) bit of location 1 and $M_{68}$ identifies the eighth (least significant) bit of location 6. The calibration routine determines the bits for each of the six tones so when the time comes to detect a particular tone, the stored settings for the switches 2–8 for the center frequency for that tone are obtained from the RAM 46 and applied to the seven switches 2–8. Since only seven switches 2–8 are involved to control the connection of the seven resistors 12–18 and 8-bits are available at each memory location, it is convenient to use only seven of the eight bits. Accordingly, switch 2 is controlled by $M_{i2}$, the second bit at a memory location for tone i and switch 3 is controlled by $M_{i3}$, etc. For the six tones mentioned earlier, i=1 is for tone 1100 HZ, i=2 for 1300 HZ, i=3, for 1650 HZ, i=4 for 1850 HZ, i=5 for 2100 HZ and i=6 for 2400 HZ.

With the 42 bits (6 tones, 7 bits per tone) determined by the calibration routine, the circuitry is then in condition to carry out the task of tone detection. The program for the microprocessor, which is stored in the ROM 44, identifies which tone is to be sought causing the calibration information to be used for the selective operation of switches 2–8 to connect the required resistors of resistors 12–18 in parallel with resistor 11. When the tone detector 20 responds to a tone that falls within the bandwidth of the tone decoder 20, the tone decoder 20 will lock on that tone, provide a locked output to the interface adapter 48 and initiate a measurement of the tone to which the tone decoder is locked. Once the measurement has been made, the measured frequency is compared with the frequency measurement table stored in the ROM 44 and if it is found to be within the prescribed bandwidth, the tone that was sought is considered detected.

Figure 7:
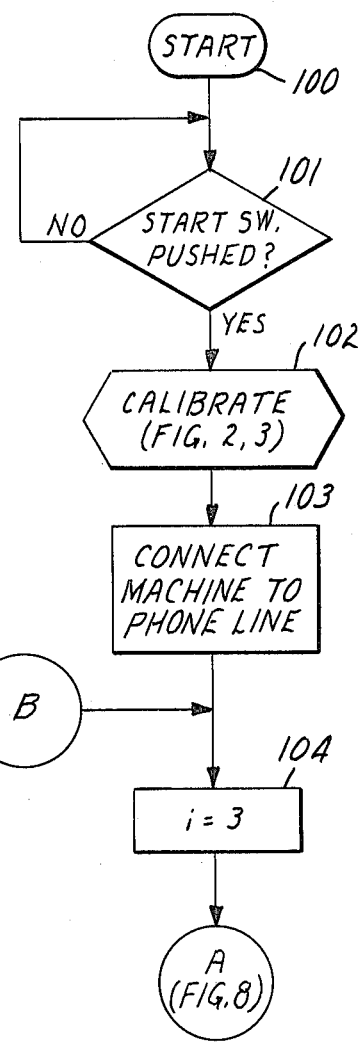
Figure 6:
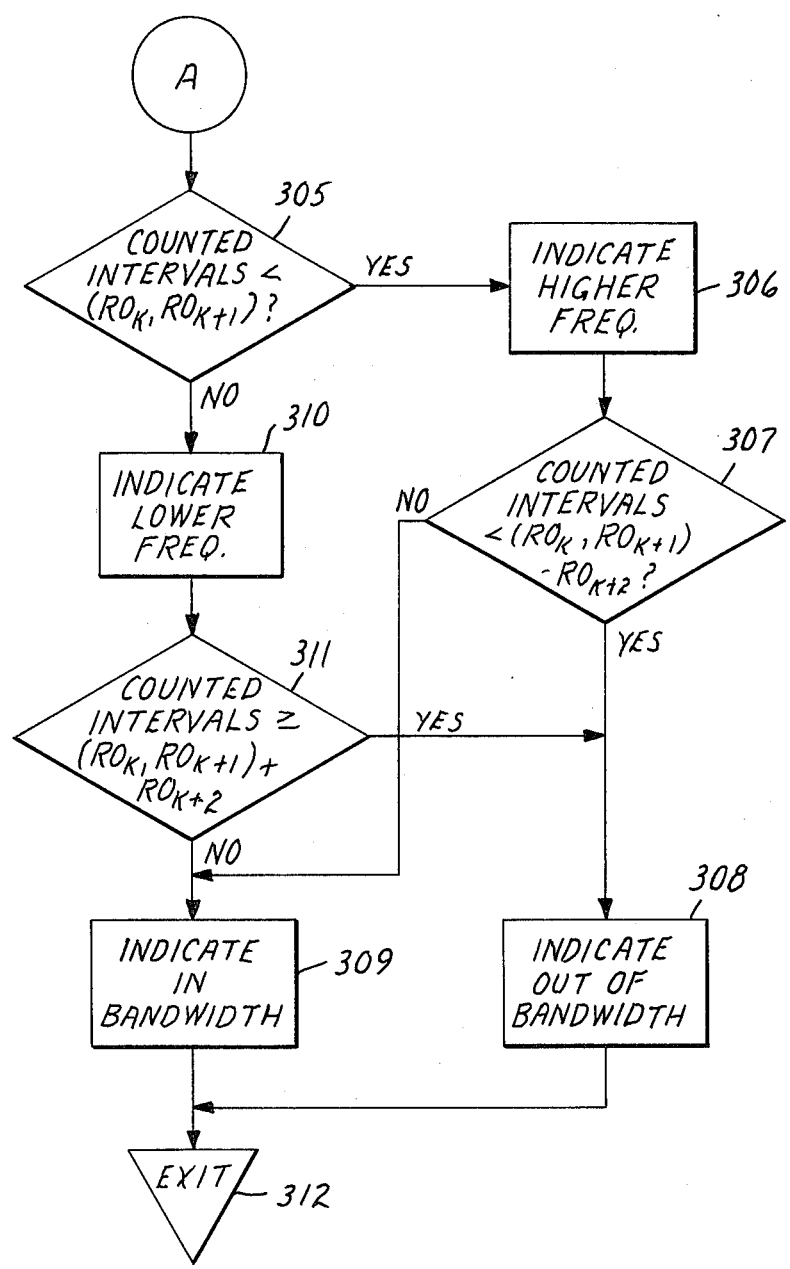
Figure 8:
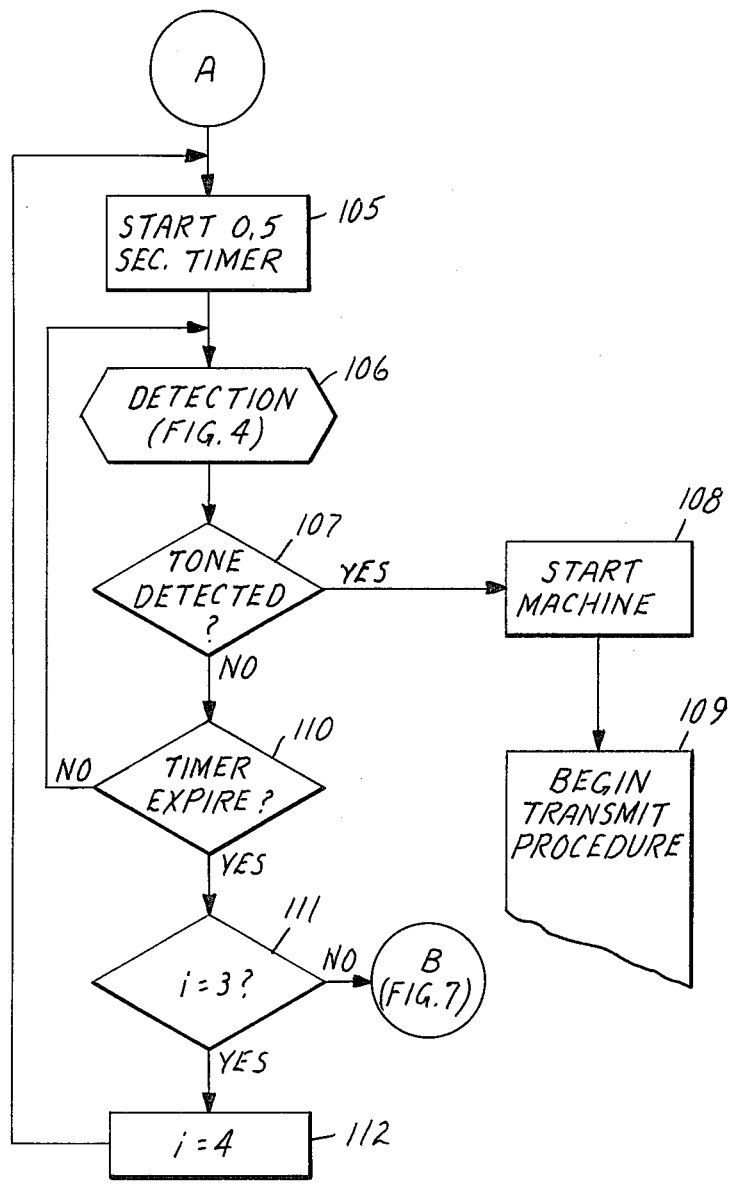

With the foregoing explanation given with respect to FIG. 1, consideration will be given to FIG. 1 in connection with the flow diagrams of FIGS. 2–8 which will provide a more detailed understanding of the operation of the circuitry of FIG. 1 and provide those of ordinary skill in the art with sufficient information to program the microprocessor 42 to cause the circuitry of FIG. 1 to operate per the flow diagrams. For purposes of illustration, the flow diagrams are based on the use of the circuitry of FIG. 1 with a facsimile machine wherein the facsimile machine when ready to transmit a document, must receive either a 1650 HZ or 1850 HZ tone to begin the transmission. The flow diagrams set forth in FIGS. 7 and 8 are for a facsimile machine that is used to illustrate the tone detector circuitry operation. The start of the flow diagram of FIG. 7 is indicated at 100. As indicated at step 101, a determination is made as to whether the start switch for the machine has been operated. Nothing happens until the operator pushes the start switch for the facsimile machine. Once this is done the calibration procedure as indicated at step 102 is entered.

Figure 2:
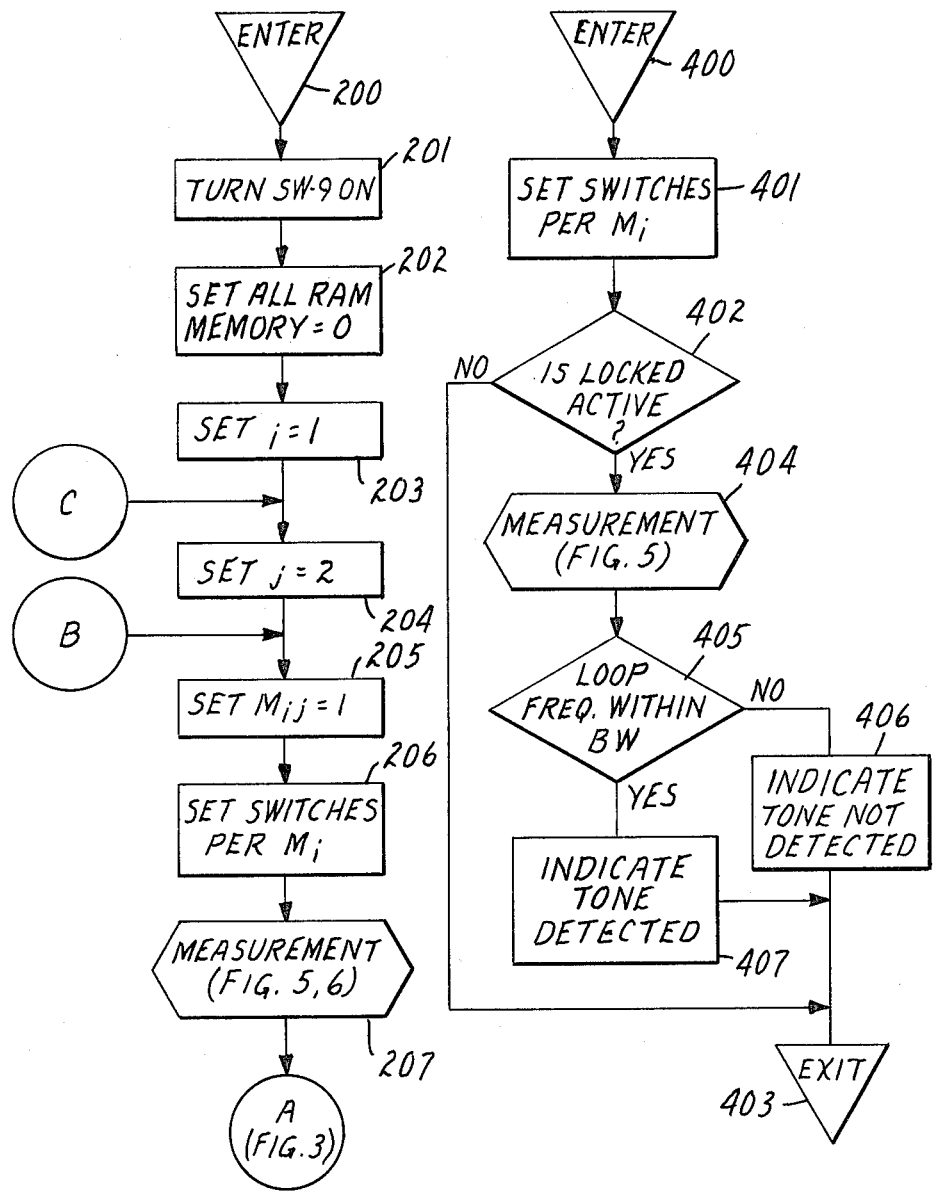
Figure 3:
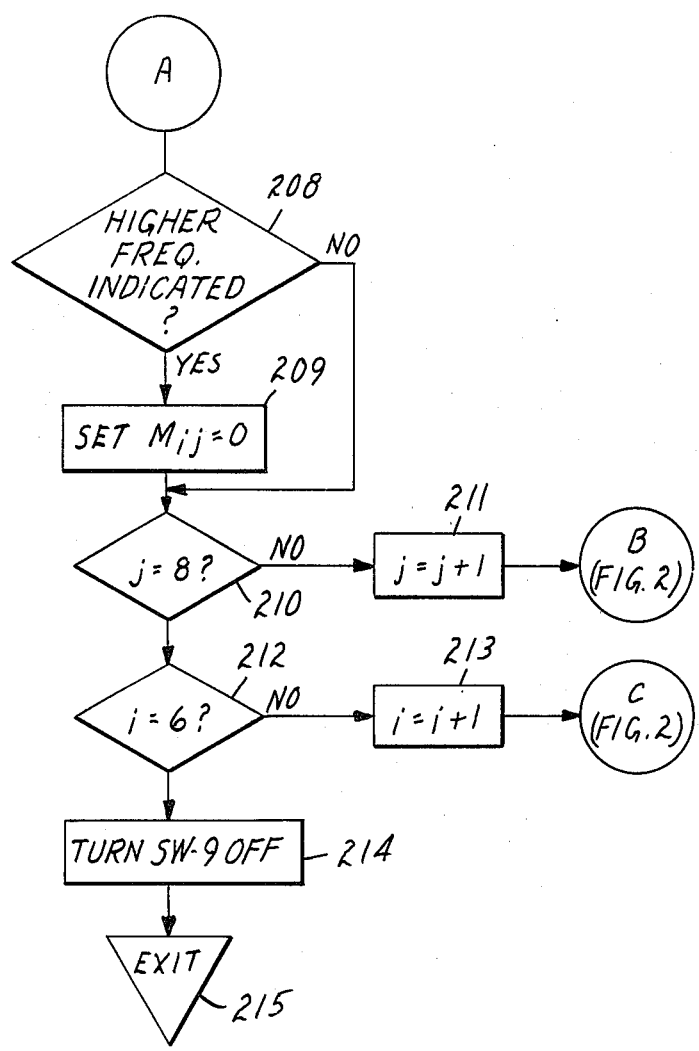

Reference must be made to the flow diagrams set forth in FIGS. 2 and 3 for the calibration routine. Entry of the calibration routine is indicated at 200. The next event is indicated at 201 which provides for the turning on of switch 9 of FIG. 1 which serves to short out any input in the tone decoder 20 to prevent the decoder 20 from locking to an input signal. The routine then requires that the RAM 46 be set so that its memory is at 0, which is indicated at 202. This removes any prior calibration information. Since the calibration routine is established for the purpose of calibrating the tone detector 20 for each of the six tones utilized in the operation of the facsimile machine, the flow diagram of FIG. 2 at step 202 indicates that tone i=1, i.e. 1100 HZ, will be considered first requiring the memory position pointer i to be set equal to 1. The next step 204 requires that the bit position pointer for memory location 1 be set to be equal to 2 (position 1 is not used). Referring to the next step 205 of the flow diagram, the bit in memory for i=1 and j=2 is set to be equal to 1. Referring to the next step 205 of the flow diagram, the memory position for i=1 and j=2 is set to be equal to 1. Referring to step 206 the switches 2-8 are then set according to the memory location for tone i=1, which for the procedure just outlined means that only switch 2 will be turned on causing resistor 12 to be connected in parallel with resistor 11. The flow diagram then indicates at 207 that the measurement procedure or measurement flow diagram set forth in FIGS. 5 and 6 then entered.

Figure 5:
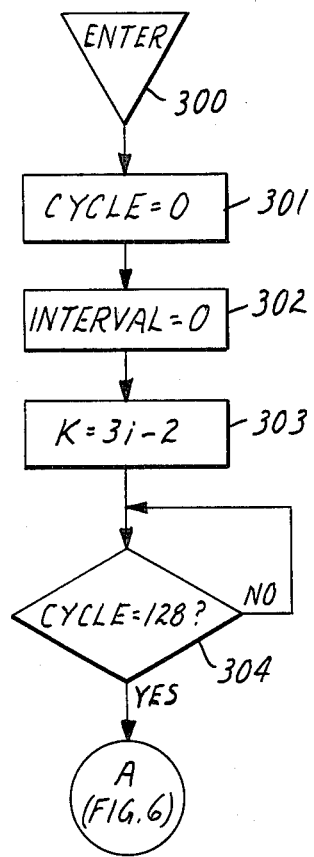

Referring to FIG. 5, entry of the flow diagram for the measurement function is indicated at 300. With the measurement flow diagram entered, the counter provided in the interface adapter 48 for counting the cycles of the frequency provided by tone decoder 20 is set to 0 as indicated at 301 with the counter provided in the interface adapter 48 for counting the number of 256 microsecond intervals also set to 0 as indicated at 302. Step 303 of the flow diagram establishes the memory location K in the ROM 44 where the upper half of the 16 bit value corresponding to the number of time intervals for the tone i is located. As indicated at 302, $k=3i-2$. In this case i is equal to 1 so k is 1. As indicated at the next step 304, the flow diagram requires that a determination be made when the count for the counter used to count the number of cycles of the signal provided by the tone decoder 20 reaches 128. As indicated earlier, the number of 256 microsecond intervals determined by the interval counter at the time the cycle count reaches 128 is a measure of the frequency. This measured value for the frequency is used at step 305 in FIG. 6 together with the frequency measurement table in the ROM 44 for determining whether the counted intervals is less than the number of intervals indicated by the first two entries in the ROM 44 for the frequency being calibrated, i.e., 1100 HZ. If the counted intervals are less than the number of intervals indicated by the frequency measurement table information contained in the ROM 44, the frequency provided by the tone decoder with resistance 12 connected in parallel with resistance 11 is higher than the frequency as indicated by the ROM 44 information. This would cause the implementation of step 306 of the flow diagram per FIG. 6 where such higher frequency indication is given. The flow diagram at step 307 then provides for a determination as to whether the measured frequency is within or outside of the bandwidth as set forth in the frequency measurement table in ROM 44. As indicated in the flow diagram for step 307, if the counted intervals is less than the number of intervals for the desired frequency per the frequency measurement table in ROM 44 when reduced by the bandwidth as stored in the frequency measurement table, an indication will be given at step 308 that the measured frequency is out of bandwidth. Otherwise, an indication will be given at step 309 that the measured frequency is within the bandwidth per the frequency measurement table of ROM 44. Referring back to step 305, if the counted intervals were greater than the number of intervals as set forth in the frequency measurement table in ROM 44, step 310 would indicate the measured frequency was lower than that per the frequency measurement table information. In this case, a determination is also made as to whether the measured frequency is within or outside of the bandwidth per the frequency measurement table in ROM 44. With a determination made that the measured frequency is lower than the desired frequency as indicated by the frequency measurement table stored in the ROM 44, it is necessary that a determination be made as to whether the measured frequency is within or outside of the bandwidth per the frequency measurement table. This requires that a determination be made as to whether the counted intervals for the measured frequency are greater than or equal to the number of intervals indicated for the frequency as set forth in the frequency measurement table in ROM 44 plus the bandwidth information set forth in the frequency measurement table. If the counted intervals for the measured signal is greater or equal to such amount this indicates that the measured frequency is outside the bandwidth as set forth in the frequency measurement table and if the counted intervals are less than such quantity this provides an indication that the measured fequency is within the bandwidth per the frequency measurement table. Such a determination is indicated at step 311 with the out of bandwidth indication, when pertinent, given at step 308 and the in bandwidth indication, when present, given at step 309. Upon completion of either step 308 or 309, the measurement routine is exited as indicated at 312. With the measurement routine, which was initiated per step 207 of FIG. 2, thus completed, FIG. 2 indicates that the calibration routine is continued at FIG. 3. The indication established at 306 or 310 in connection with the measurement routine set forth in FIG. 6 as to whether the measured frequency is higher or lower than the frequency being calibrated is utilized at step 208 in FIG. 3 where query is made as to whether a higher frequency is indicated. Thus, if the phase locked loop frequency of the tone decoder 20, which was measured, had been found to be less than the tone frequency per the frequency measurement table in ROM 44, i.e., a higher frequency indication is not present, the setting of $M_{12}=1$ made at step 205 of FIG. 2 would remain and step 210 would then be next. Step 210 determines whether j is equal to 8, i.e., it determines whether all bit portions for memory position $M_1$ have been determined for the control of switches 2–8 for the calibration for tone i=1 (1100 HZ). If it had been found that the measured frequency was greater than the frequency per the frequency measurement table in ROM 44 for the frequency under consideration, i.e., a higher frequency indication is present, the memory position $M_{12}$, which had been made equal to 1, at step 205 of FIG. 2, would be changed to 0 before proceeding to step 210. The step for setting memory position $M_{12}$ to 0 is indicated at 209. Since it will be determined at step 210 that j is not equal to 8, the flow diagram proceeds to step 211 where a new j is determined by adding one to the old value for j. For the procedure described to this point, the new j is 3. Return is then made to step 205 of the flow diagram set forth in FIG. 2. With the calibration still proceeding for the first tone frequency, i.e., i is equal to 1, and j now equal to 3, the memory position $M_{13}$ is set equal to 1. Proceeding to step 206, the switches 2–8 are set per the memory position $M_1$ in the RAM 46. With only the memory bit position $M_{13}$ set equal to 1 at this point in the calibration, only switch 3 is turned on to connect resistor 13 in parallel with resistor 11. With the timing resistance thus established, a measurement per step 207 is then made of the frequency provided by the tone decoder 20. The measurement procedure is then carried out in accordance with flow diagrams set forth in FIGS. 5 and 6 which have already been described and upon completion of the measurement step 207, the calibration procedure as has been described in connection with FIG. 3 is continued. As before, a determination is made at step 208 as to whether the frequency provided by the tone decoder 20 is greater than the tone frequency for which calibration is being sought. If it is a greater than situation, the memory position $M_{13}$ is set to 0 otherwise it remains set at 1. The procedure that has been described will be repeated for tone i, where i is equal to 1, until such time as each bit position j for such memory position is established. When this has been accomplished, j will equal 8 at the time that step 210 is considered causing step 212 to be next where a determination is made as to whether calibration has been completed for all six tones, i.e. the question as to whether i is equal to 6 is asked. Since the description given to this point has been concerned only with i equal to 1, i.e., the first tone of 110 HZ, the flow diagram takes us to step 213 where a new i is established which is equal to the old i plus 1. The operation of the circuitry then proceeds according to the flow diagram of FIG. 2 at step 204 which requires the setting of j equal to 2. The memory position and bit position within that memory, which in this case is memory position $M_{22}$, is set equal to 1 at step 205. The calibration procedure then proceeds as before except in this case i equals 2, so the bits for the new memory position $M_2$, which is the calibration memory position for the second tone, i.e. 1300 HZ, will be determined. The foregoing calibration procedure that has been described will be continued for each of the six tones so that when step 212 in FIG. 3 is reached in the course of completing the calibration for the sixth tone, the query made at step 212 as to whether i equals 6 will be answered in the affirmative, causing the operation to proceed to step 214 which serves to turn off switch 9. The routine of FIG. 3 is then exited at step 215. With switch 9 off, the circuitry in condition for receiving a tone input to tone decoder 20 via resistor 30 and capacitor 32. With the calibration procedure called for at step 102 of the flow diagram of FIG. 7 completed, the next step 103 in FIG. 7, which calls for connection of a facsimile machine to the phone line, is completed.

Before considering the flow diagrams any further, it should be pointed out that the facsimile machine, considered for illustrating the operation of the tone detection circuitry of FIG. 1, that requires the detection of either tone 1650 HZ (i=3) or tone 1850 HZ (i=4) before the machine can be started for purposes of beginning the transmitting procedure. The tone detection circuitry of FIG. 1 is controlled so that it will try to detect one of the tones for a short period of time, and if such tone is not detected in such time, it is then conditioned to detect the other tone for the same period of time. If the second tone is not detected, the procedure is repeated until one of the two tones is detected.

Returning then to the flow diagram of FIG. 7, step 104 is next which establishes tone 3 (1650 HZ) as the tone to be detected. The flow diagram is then continued at FIG. 8 where a time period of a half a second is started as indicated at step 105. The detection procedure at step 106, which is set forth in more detail at FIG. 4, is entered. Such detection procedure will not be discussed at this time. Once the detection routine has been completed, a determination is made at step 107 as to whether the tone sought was detected during the detection routine. If the tone sought has been detected, step 108, which calls for the starting of the facsimile machine, is completed. The procedure for transmitting the document is then initiated as indicated at step 109.

In the event tone 3 (1650 HZ), which was sought, was not detected, query is made at step 110 as to whether the time period, which was started at step 105, has expired. If it has not expired, the detection step 106 and step 107, which indicated whether the sought tone was detected, are repeated. If the time period began at step 105 has expired, a query is made at step 111 as to whether the tone for i=3 is being sought. In this case the answer is yes, so step 112 is then carried out which calls for tone 4 to be sought i.e. i=4. With i equal to 4 the flow diagram returns to step 105 and the procedure with respect to steps 105 through 110 is repeated. Assuming that tone for i=4, i.e. 1850 HZ, is not detected and the time period started at step 105 has expired, the next step is step 111, which requires a determination as to whether i=3. In this case i is not equal to 3, so the flow diagram continues at FIG. 7 at step 104 where i is equal to 3 so that tone 1650 HZ will again be sought. The procedure set forth in FIG. 8 at 105 is then again entered and is carried out as has been described until such time as either tone 3 (1650 HZ) or tone 4 (1850 HZ) is detected. As has been indicated, if step 107 indicates a tone has been detected, the machine start step 108 and transmit step 109 will follow. Other procedures relating to the further operation of the facsimile machine may call for other tones of the remaining four tones to be detected. Such procedures are not considered and as they would not contribute to the description already given for the operation of the tone detection circuitry of FIG. 1.

When considering FIG. 8, details of the detection routine called for at step 106 were not considered. Details of the detection procedure is set forth in the flow diagram of FIG. 4, and will now be considered. Entry of the detection procedure is indicated at step 400. The next step 401 calls for the setting of switches 2–8 of FIG. 1 in accordance with the calibration information that was recorded in RAM 46 during the calibration procedure for the tone that is sought to be detected. Thus, if tone 3 (1650 HZ) is being sought the switches 2-8 are set according to the information at memory location $M_3$ in RAM46. The next step 402 is a determination as to whether a locked output is present at conductor 50 from tone decoder 20. If a locked output is present, it is an indication that the tone decoder 20 detected a tone at its input that is within the bandwidth of the tone decoder 20. If a locked output is not present, the detection routine is exited as indicated at 403. If the locked output 50 is active, the measurement procedure as indicated at 404 and set forth in FIG. 5 and 6 and which has been previously described, is entered. The measurement procedure will provide an indication as to whether the measured signal is within or outside of the bandwidth required for the frequency measurement table stored in the ROM 44. The step 405 of the detection routine per FIG. 4, which follows the measurement procedures, calls for a determination as to whether the frequency measured is within the bandwidth. If it is not within the bandwidth, an indication that a tone is not detected is provided at step 406 and the routine is exited as indicated at step 403. If it is within the bandwidth, step 407 is entered which provides an indication that the tone sought is detected and the detection routine is then exited as indicated at step 403.

The description that has been set forth with respect to FIG. 1 does not provide any information as to how the number of resistors or values of the resistors used to establish the timing resistance 28 for the tones sought to be detected is determined. As mentioned earlier, specifications provided with a tone decoder, such as type NE567, indicate the range of resistance that can be used for the timing resistance 28. In the case of an NE567 unit, the range of timing resistance 28 can be 2K to 20K ohms. In dealing with the question of the number of resistors to be used to provide the timing resistance 28, the resistance 11 is fixed in the circuit at all times and the remaining resistors to be used are switched in and out under the control of the program as described. Resistor 11 is selected to be less than the maximum resistance allowed by the specification. This insures that the resistance presented when other resistors connected in parallel with resistor 11 is always less than the maximum resistance allowed by the specifications for the tone decoder 20. The remaining resistors, that will be used are selected using the following equation:

$$\frac{1}{R_1} + \frac{1}{R_n} = \frac{100 + \frac{MDBW}{2}}{100} \sum_{a=1}^{n-1} \frac{1}{R_a} \qquad \text{(eq. 1)}$$

where $R_1$ is the value for resistor 11, and MDBW is the minimum detection bandwidth in percent given by the specification for the tone decoder 20 for the minimum actual signal amplitude to be provided to the decoder 20. The number of resistors (n) necessary to cover the frequency range that may be of interest for the tone detection circuitry is given by:

$$F_{max} \leq \frac{1.1}{C} \sum_{a=1}^{n} \frac{1}{R_a}; \qquad \text{(eq. 2)}$$

where C is the value of the timing capacitor 26.

In the case of the circuitry of FIG. 1, wherein it was indicated the range of tones to be detected extended from 1100 HZ to 2400 HZ and assuming a detection bandwidth of 6% with an accumulated component tolerance of plus or minus 30%, the calculation of the value for capacitor 26 and the values for resistances 11 through 18 is as follows where the equation for calculating capacitor 26 was mentioned earlier in the description:

$$C = 1.1/(F_{min} \times R_{max}) \qquad \text{(eq. 3)}$$

Using $F_{min} = 1100$ HZ $- 30\% = 770$ HZ and $R_{max}$ or $R_1 = 18k$. Using 10% less than the upper end of the timing resistance range ensures that a 18K±5% resistor will remain below 20K over temperature and component tolerance. Using equation (3), $$C = 1.1/(770 \times 18 \times 10^3) = 0.079 \text{ f}$$

$$C = 0.082 \mu f \text{ (closest 10\% value)}$$

Using equation (1):

$$\frac{1}{R_2} = \frac{100 + \frac{MDBW}{2}}{100} \left(\frac{1}{R_1}\right) - \frac{1}{R_1}$$

$$\frac{1}{R_2} = \frac{1.03}{R_1} - \frac{1}{R_1} = \frac{.03}{R_1}$$

$$R_2 = 600K \text{ ohms}$$

$$\frac{1}{R_3} = 1.03 \left(\frac{1}{R_1} + \frac{1}{R_2}\right) - \frac{1}{R_1}$$

$$R_3 = 296K \text{ ohms}$$

and similarly $R_4 = 146K$ ohms; $R_5 = 72K$ ohms; $R_6 = 35K$ ohms; $R_7 = 17.4K$ ohms; and $R_8 = 8.6K$ ohms.

It is noted that after $R_8$ is determined, the required inequality is satisfied for equation (2).

$$F_{max} \leq \frac{1.1}{C} \sum_{a=1}^{n} \frac{1}{R_a}; \text{ where}$$

$$F_{max} = 2400HZ + 30\% (2400) = 3120HZ$$

and $C = .082 \mu f$ and $n = 8$ and $\sum_{a=1}^{8} \frac{1}{R_a} = 28.3 \times 10^{-5}$.

Therefore:

$$3120 \leq 13.4 \times 10^6 \times 28.3 \times 10^{-5}$$

$$3120 \leq 3792$$

Accordingly eight resistors are required. Since resistors 12-18 of FIG. 1 are required to be arranged in order of increasing magnitude, the values of resistors 12-18 in ohms are as follows:
Resistor 12 = 8.6K
Resistor 13 = 17.4K
Resistor 14 = 35K
Resistor 15 = 72K
Resistor 16 = 146K
Resistor 17 = 296K
Resistor 18 = 600K The foregoing description of the invention sets forth two ways for changing the product of the timing capacitance 26 and timing resistance 28, i.e., by the use of a fixed capacitance in series with a plurality of resistors selectively connectable in parallel or a fixed resistor in series with plurality of capacitors selectively connectable in parallel. It is apparent to those of ordinary skill in the art that there are many ways for altering the product of the timing capacitance 26 and timing resistance 28. For example, using a fixed capacitance 26, the timing resistance 28 can be varied by the use of a plurality of resistors connected in series, which are selectively shorted out by a switch provided for each resistor. Similarly, a fixed resistor could be connected in series with a plurality of series connected capacitors which are selectively shorted out by a switch provided for each capacitor. Further, a plurality of capacitors and a plurality of resistors could be used in various series/parallel arrangements with switches provided for making selective connections to vary the product of the timing resistance and timing capacitance.

I claim:

1. Tone detection circuitry for determining the receipt of a tone signal having a frequency within a selected one of a plurality of bandwidths including:
   timing resistance;
   timing capacitance;
   a tone decoder operatively connected to said timing resistance and said timing capacitance, said tone decoder providing a signal output at a free running frequency that is inversely proportional to the product of said timing capacitance and timing resistance and providing a signal output at the frequency of an input tone signal to said decoder when such input tone signal is within the response bandwidth of the decoder; and
   control means operatively connected to said tone decoder, said timing resistance and said timing capacitance, said control means providing a calibration routine which is operable subsequent to each energization of the control means for determining the product of said timing resistance and said timing capacitance for each of the plurality of bandwidths for establishing the free running frequency of said decoder as close as possible to the center frequency of each of the plurality of bandwidths, providing a retrievable record based on the product of the timing resistance and timing capacitance determined for establishing the free running frequency of said tone decoder for each of the plurality of bandwidths and providing for the selective retrieval of said retrievable record for any one of the plurality of bandwidths and establishing the product of said timing resistance and said timing capacitance in accordance with the retrieved record.

2. Tone detection circuitry according to claim 1 wherein said control means provides for measuring of the frequency of any signal output from said decoder, said control means having information indicative of each center frequency and bandwidth for each of the plurality of bandwidths for making a determination with respect to a selected center frequency and bandwidth as to whether a measured signal output is within the bandwidth.

3. Tone detection circuitry according to claim 1 wherein said timing resistance includes a plurality of resistors selectively connectable in parallel, said control means controlling the selective connection of said resistors in parallel for determining the product of said timing resistance and said timing capacitance.

4. Tone detection circuitry according to claim 1 wherein said control means includes a memory for storing said retrievable record and a programmed microprocessor operatively connected to said timing resistance, said timing capacitance, said tone decoder and said memory.

5. Tone detection circuitry according to claim 2 wherein said control means includes a memory containing said information indicative of each center frequency and bandwidth and a programmed microprocessor operatively connected to said timing resistance, said timing capacitance, said tone decoder and said memory.

6. Tone detection circuitry according to claim 4 wherein said timing resistance includes a plurality of resistors, a plurality of switches, one for each resistor of said plurality of resistors for selectively connecting said resistors in parallel, each of said switches operatively connected to said programmed microprocessor for selective operation of said switches by said programmed microprocessor in accordance with the selective retrieval of said retrievable record from said memory for determining the product of said timing resistance and said timing capacitance for any one of the plurality of bandwidths.

* * * * *